United States Patent
Rajagopal et al.

(10) Patent No.: US 11,276,662 B2
(45) Date of Patent: Mar. 15, 2022

(54) COMPRESSIBLE FOAMED THERMAL INTERFACE MATERIALS AND METHODS OF MAKING THE SAME

(71) Applicant: LAIRD TECHNOLOGIES, INC., Chesterfield, MO (US)

(72) Inventors: Vijayaraghavan Rajagopal, Lincoln, NE (US); Eugene Anthony Pruss, Avon Lake, OH (US); Richard F. Hill, Parkman, OH (US)

( * ) Notice: Subject to any disclaimer, the term of this patent is extended or adjusted under 35 U.S.C. 154(b) by 159 days.

(21) Appl. No.: 16/513,031

(22) Filed: Jul. 16, 2019

(65) Prior Publication Data

US 2019/0348388 A1 Nov. 14, 2019

Related U.S. Application Data

(63) Continuation of application No. PCT/US2018/013947, filed on Jan. 17, 2018.

(60) Provisional application No. 62/447,012, filed on Jan. 17, 2017.

(51) Int. Cl.
| | | |
|---|---|---|
| *H01L 23/00* | (2006.01) | |
| *F28F 13/00* | (2006.01) | |
| *H01L 23/433* | (2006.01) | |
| *H01L 23/373* | (2006.01) | |
| *C08J 9/12* | (2006.01) | |

(52) U.S. Cl.
CPC ............ *H01L 24/29* (2013.01); *F28F 13/003* (2013.01); *H01L 23/4334* (2013.01); *H01L 24/27* (2013.01); *H01L 24/83* (2013.01); *C08J 9/122* (2013.01); *H01L 23/3731* (2013.01); *H01L 23/3736* (2013.01); *H01L 23/3737* (2013.01); *H01L 2224/29005* (2013.01); *H01L 2224/29187* (2013.01); *H01L 2224/29191* (2013.01); *H01L 2224/29195* (2013.01); *H01L 2224/29387* (2013.01); *H01L 2224/29391* (2013.01); *H01L 2924/3025* (2013.01)

(58) Field of Classification Search
CPC ............. H01L 23/4334; H01L 23/3733; H01L 2224/29195; H01L 2224/29391; H01L 2224/29291; H01L 2224/29791; H01L 2224/29891; H01L 2224/29187; F28F 13/003

See application file for complete search history.

(56) References Cited

U.S. PATENT DOCUMENTS

| | | | | |
|---|---|---|---|---|
| 5,781,412 A | * | 7/1998 | de Sorgo | ................ H01L 23/42 |
| | | | | 257/702 |
| 2007/0230131 A1 | * | 10/2007 | Bunyan | ................ H05K 9/0083 |
| | | | | 361/704 |
| 2012/0048528 A1 | | 3/2012 | Bergin et al. | |
| 2012/0058377 A1 | * | 3/2012 | Sastry | ..................... B60L 50/64 |
| | | | | 429/94 |
| 2012/0133072 A1 | | 5/2012 | Bunyan et al. | |
| 2015/0359134 A1 | * | 12/2015 | Soong | .................. H05K 7/2039 |
| | | | | 361/720 |

FOREIGN PATENT DOCUMENTS

| | | |
|---|---|---|
| KR | 10-2016-0122172 A | 10/2016 |
| KR | 20160122172 | 10/2016 |
| WO | WO2015187439 | 12/2015 |
| WO | WO-2015187439 A1 | 12/2015 |

OTHER PUBLICATIONS

International Search Report and Written Opinion for PCT/US2018/013947 filed Jan. 17, 2018, which is the parent application to the instant application, 11 pages.

* cited by examiner

*Primary Examiner* — Amar Movva
(74) *Attorney, Agent, or Firm* — Harness, Dickey & Pierce, P.L.C.; Anthony Fussner

(57) ABSTRACT

Disclosed are exemplary embodiments of compressible foamed thermal interface materials. Also disclosed are methods of making and using compressible foamed thermal interface materials.

20 Claims, No Drawings

COMPRESSIBLE FOAMED THERMAL INTERFACE MATERIALS AND METHODS OF MAKING THE SAME

CROSS-REFERENCE TO RELATED APPLICATIONS

This application is a U.S. continuation patent application of PCT International Application No. PCT/US2018/013947 filed Jan. 17, 2018 (published as WO 2018/136453 on Jul. 26, 2018), which claims priority to and the benefit of U.S. Provisional Patent Application No. 62/447,012 filed Jan. 17, 2017. The entire disclosures of the above applications are incorporated herein by reference.

FIELD

The present disclosure relates to compressible foamed thermal interface materials and methods of making the same.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

DETAILED DESCRIPTION

Example embodiments will now be described more fully.

Conventional thermal interface materials are typically not compressible. Instead, conventional thermal interface materials deflect upon the application of pressure, such as when sandwiched between a heat source (e.g., a PCB board-mounted component, etc.) and a heat removal/dissipation structure (e.g., a heat spreader, a heat sink, a heat pipe, a device exterior case or housing, etc.). Although conventional thermal interface materials that deflect instead of compress may work well for their intended purposes, compressible thermal interface materials may work better in some systems. For example, using a deflectable incompressible thermal interface material between the battery walls of an electrical vehicle (EV) may not work particularly well. This is because the deflection and movement of the incompressible thermal interface material to account for expansion and contraction of the EV battery walls may cause too much pressure during thermal cycling.

Disclosed herein are exemplary embodiments of compressible foamed thermal interface materials and methods of making thermal interface materials that may be truly compressible. This is unlike some conventional thermal interface materials that just deflect instead of compress.

In exemplary embodiments, gas (e.g., air, nitrogen, etc.) is introduced into a cure-in-place thermal interface material before the cure-in-place thermal interface material is dispensed. For example, a predetermined amount of nitrogen may be introduced into a predetermined amount of a thermoset two-part, silicone-based thermal gap filler. The thermoset two-part, silicone-based thermal gap filler may include first part A and a second part B. Parts A and B may each include silicone, aluminum oxide, and melamine. Either part A or part B also includes the catalyst for initiating or starting the curing process.

Parts A and B of the thermoset two-part, silicone-based thermal gap filler may be separately introduced or pumped from separate cartridges through inlets into a high speed mixer. Then, the gas may be introduced into the mixture of parts A and B via an inlet downstream of the inlets by which parts A and B were introduced or pumped into the high speed mixer. The gas may be injected at high pressure and at high revolutions per minute (RPMs) (e.g., equal to or at least about 2000 RPMs, etc.).

For example, the gas may be injected into the cure-in-place thermal interface material at 2000 RPMs immediately prior to dispensing the cure-in-place thermal interface material. At sufficiently high enough RPMs (e.g., 2000 RPMs, etc.), the gas is chopped and mixed into the cure-in-place thermal interface material before it is dispensed. The gas may be injected via an inlet upstream of the outlet through which the cure-in-place thermal interface material is dispensed and exposed to the atmosphere. For example, the gas may be injected via an inlet that is immediately upstream of or just before the nozzle of a dispenser that will dispense the cure-in-place thermal interface material. In this example, the system may be configured such that there are not any intervening inlets or outlets between the gas inlet and the dispenser nozzle.

Upon exposure to or reaching the atmosphere, the gas expands to leave a foamed thermal interface material that subsequently cures in place on the surface on which it was dispensed. After curing, the foamed thermal interface material is compressible upon application of pressure. Instead of just being deflectable, the compressible foamed thermal interface material is capable of expanding and contracting without having to physically move to or from the interface, e.g., an interface between the compressible foamed thermal interface material and a heat source or heat removal/dissipation structure, etc.

The compressible foamed thermal interface material has a closed porosity such that the matrix is connected relatively well. Although the volume of gas entrapped within the compressible foamed thermal interface material will reduce the thermal conductivity as compared to the base unfoamed thermal interface material, the reduction in thermal conductivity is relatively low. Thus, the thermal conductivity remains sufficiently high enough (e.g., at least about 1.5 Watts per meter Kelvin (W/mK), etc.) for the compressible foamed thermal interface material.

The compressible foamed thermal interface material may have a pore density within a range from about 20% to about 50% (e.g., 20%, 25%, 50%, etc.), less than 20%, greater than 50%, etc. The compressible foamed thermal interface material may consist of only the original chemical components, e.g., a matrix, thermally-conductive filler within the matrix, and injected gas that remains entrapped within the closed pores of the compressible foamed thermal interface material. The compressible foamed thermal interface material may be made without using foaming agent that would otherwise leave a chemical/foaming agent residue/signature on the compressible foamed thermal interface material. For example, a compressible foamed thermal interface material disclosed herein may be a two-part cure-in-place thermal interface material that includes a first part A and a second part B. The first part A and second part B may each include silicone, aluminum oxide, and melamine. One of the first part A or the second part B may include a catalyst for initiating the curing process. In this example, the compressible foamed thermal interface material may consist of only these first and second parts A and B and the injected gas (e.g., air, nitrogen, etc.) that remains entrapped within the closed pores of the compressible foamed thermal interface material and not include any foaming agent.

The compressible foamed thermal interface material may be dispensed onto a wide range of surfaces, structures, devices, etc. By way of example, the compressible foamed thermal interface material may be dispensed onto a cover of a board level shield (BLS), a device housing, a component or heat source on a PCB, a heat removal/dissipation structure (e.g., a heat spreader, a heat sink, a heat pipe, a device exterior case or housing, etc.), etc.

In exemplary embodiments, the compressible foamed thermal interface materials may comprise dispensable thermal interface materials, such as cure-in-place thermal interface materials, thermal putties, thermal gap fillers, thermal phase change materials, thermally-conductive EMI absorbers or hybrid thermal/EMI absorbers, thermal pads, thermal greases, thermal pastes, etc. By way of example, a dispensable thermal interface material of Laird may be used, such as one or more of Tflex™ CR200, Tputty™ 403, Tputty™ 504, and/or Tputty™ 506 dispensable thermal gap fillers. For example, the compressible foamed thermal interface material may comprise a two-part cure in place ceramic filled silicone-based thermal gap filler that is curable at room temperature, has a low viscosity (e.g., no more than about 260,000 cps before mixing, etc.), good thermal conductivity (e.g., at least about 2 W/mK, etc.), and that is soft and compliant (e.g., hardness (Shore 00) 3 second of no more than about 45, etc.). As another example, the compressible foamed thermal interface material may comprise a single-part silicone-based thermal gap filler that is soft, compliant, that has low abrasion or is non-abrasive, and that has good thermal conductivity (e.g., at least about 2.3 W/mK, etc.). As a further example, the compressible foamed thermal interface material may comprise a soft silicone-based thermal gap filler that is a ceramic-filled dispensable silicone gel, that is soft and compliant, that has good thermal conductivity (e.g., at least about 1.8 W/mK, etc.), that can be can be applied like grease, and that is easily dispensable from equipment such as screen print, syringe, and automated equipment. As yet a further example, the compressible foamed thermal interface material may comprise a soft single-part silicone putty thermal gap filler in which no cure is required, that has good thermal conductivity (e.g., at least about 3.5 W/mK, etc.), and that is soft, compliant, non-abrasive, and dispensable.

A compressible foamed thermal interface material may comprise a wide range of different thermally conductive fillers. The thermally conductive fillers may have a thermal conductivity of at least 1 W/mK or more. Example fillers include aluminum oxide, copper, zinc oxide, boron nitride, alumina, aluminum, graphite, ceramics, combinations thereof, etc. In addition, exemplary embodiments may also include different grades (e.g., different sizes, different purities, different shapes, etc.) of the same (or different) thermally conductive fillers. For example, a compressible foamed thermal interface material may include two different sizes of boron nitride. By varying the types and grades of thermally conductive fillers, the final characteristics of the compressible foamed thermal interface material (e.g., thermal conductivity, cost, hardness, etc.) may be varied as desired.

Other suitable fillers and/or additives may also be added to achieve various desired outcomes. Examples of other fillers that may be added include pigments, plasticizers, process aids, flame retardants, extenders, etc. For example, tackifying agents, etc. may be added to increase the tackiness of a thermal interface material, etc.

By way of further example, electromagnetic interference (EMI) or microwave absorbers, electrically-conductive fillers, and/or magnetic particles may be added such that the compressible foamed thermal interface material may be operable or usable as an EMI and/or RFI shielding material. A wide range of materials may be added to a compressible foamed thermal interface material according to exemplary embodiments, such as carbonyl iron, iron silicide, iron particles, iron-chrome compounds, metallic silver, carbonyl iron powder, SENDUST (an alloy containing 85% iron, 9.5% silicon and 5.5% aluminum), permalloy (an alloy containing about 20% iron and 80% nickel), ferrites, magnetic alloys, magnetic powders, magnetic flakes, magnetic particles, nickel-based alloys and powders, chrome alloys, and any combinations thereof. Other embodiments may include one or more EMI absorbers formed from one or more of the above materials where the EMI absorbers comprise one or more of granules, spheroids, microspheres, ellipsoids, irregular spheroids, strands, flakes, powder, and/or a combination of any or all of these shapes.

By way of background, EMI absorbers convert electromagnetic energy into another form of energy through a process commonly referred to as a loss. Electrical loss mechanisms include conductivity losses, dielectric losses, and magnetization losses. Conductivity losses refer to a reduction in EMI resulting from the conversion of electromagnetic energy into thermal energy. The electromagnetic energy induces currents that flow within the EMI absorbers having a finite conductivity. The finite conductivity results in a portion of the induced current generating heat through a resistance. Dielectric losses refer to a reduction in EMI resulting from the conversion of electromagnetic energy into mechanical displacement of molecules within the EMI absorbers having a non-unitary relative dielectric constant. Magnetic losses refer to a reduction in EMI resulting from the conversion of electromagnetic energy into a realignment of magnetic moments within the EMI absorbers.

In exemplary embodiments, a compressible foamed thermal interface material may be dispensed onto a cover or lid and/or to a board level shield (BLS). The BLS cover may be integral with or removably attachable to a fence, frame, or sidewalls of the BLS. For example, the BLS may include sidewalls that are integrally formed (e.g., stamped and then folded, etc.) with the upper surface, cover, lid, or top of the BLS. Alternatively, the sidewalls may be made separately and not integrally formed with the upper surface of the BLS. In some exemplary embodiments, the BLS may comprise a two-piece shield in which the upper surface, cover, lid, or top is removable/detachable from and reattachable to the sidewalls. In some exemplary embodiments, the BLS may include one or more interior walls, dividers, or partitions that are attached to and/or integrally formed with the BLS. In such exemplary embodiments, the BLS cover, sidewalls, and interior walls may cooperatively define a plurality of individual EMI shielding compartments. The BLS frame may include a perimeter flange extending inwardly from the top of the sidewalls in some exemplary embodiments. Alternatively, the frame may be flangeless (without an inwardly extending flange) in other exemplary embodiments. Accordingly, aspects of the present disclosure should not be limited to any particular board level shield configuration.

The cover or lid and the frame, fence, or sidewalls of the BLS may be made from a wide range of materials in exemplary embodiments. By way of example, a non-exhaustive list of exemplary materials from which the BLS or portion thereof may be made include cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. The materials disclosed in this application are provided herein for purposes of illustration only as different materials may be used depending, for example, on the particular application.

Example embodiments disclosed herein may be used with a wide range of heat sources, electronic devices, and/or heat removal/dissipation structures or components (e.g., a heat spreader, a heat sink, a heat pipe, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, a heat source may comprise any component or device that has a higher temperature than the thermal interface material or otherwise provides or transfers heat to the thermal interface material regardless of whether the heat is generated by the heat source or merely transferred through or via the heat source. Accordingly, aspects of the present disclosure should not be limited to any particular use with any single type of heat source, electronic device, heat removal/dissipation structure, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of making a compressible foamed thermal interface material, the method comprising:
   injecting gas into a cure-in-place thermal interface material before dispensing the cure-in-place thermal interface material and before curing the cure-in-place thermal interface material;
   after injecting the gas, dispensing the cure-in-place thermal interface material onto a surface and exposing the cure-in-place thermal interface material to atmosphere, whereby the gas expands and causes the cure-in-place thermal interface material to foam thereby providing a foamed cure-in-place thermal interface material; and
   after dispensing the cure-in-place thermal interface material, allowing the foamed cure-in-place thermal interface material to cure in place on the surface, thereby providing the compressible foamed thermal interface material on the surface;
   whereby the compressible foamed thermal interface has a closed porosity, and the injected gas remains entrapped within closed pores of the compressible foamed thermal interface.

2. The method of claim 1, wherein:
   dispensing the cure-in-place thermal interface material onto a surface comprises dispensing the cure-in-place thermal interface material onto a cover of a board level shield (BLS) that is removably attachable to sidewalls of the BLS; and
   allowing the foamed cure-in-place thermal interface material to cure in place on the surface comprises allowing the foamed cure-in-place thermal interface material to cure in place on the cover of the board level shield, thereby providing the compressible foamed thermal interface material on the cover of the board level shield.

3. The method claim 2, wherein the method further includes compressing the compressible foamed thermal interface material along an interface between a heat source and the cover of the board level shield to thereby establish a thermally-conductive heat path having a thermal conductivity of at least about 1.5 Watts per meter Kelvin (W/mK) from the heat source through the compressible foamed thermal interface material to the cover of the board level shield, whereby the compressible foamed thermal interface material is expandable and contractable during thermal cycling without having to physically move the compressible foamed thermal interface material to or from the interface.

4. The method of claim 1, wherein injecting gas into a cure-in-place thermal interface material comprises injecting gas into a two-part cure-in-place ceramic filled silicone-based thermal gap filler that is curable at room temperature and having a viscosity of no more than 260,000 centipoises (cps) before mixing, a thermal conductivity of at least about 2 Watts per meter Kelvin (W/mK), and a hardness (Shore 00) 3 second of no more than 45.

5. The method of claim 1,
   wherein dispensing the cure-in-place thermal interface material onto a surface comprises dispensing the cure-in-place thermal interface material onto a surface of a board level shield, a housing, a heat source, and/or a heat dissipation/removal structure; and
   wherein allowing the foamed cure-in-place thermal interface material to cure in place on the surface comprises allowing the foamed cure-in-place thermal interface material to cure in place on the surface of the board level shield, the housing, the heat source, and/or the heat dissipation/removal structure, thereby providing the compressible foamed thermal interface material on the surface of the board level shield, the housing, the heat source, and/or the heat dissipation/removal structure.

6. The method of claim 1, wherein the compressible foamed thermal interface is expandable and contractable during thermal cycling without having to physically move the compressible foamed thermal interface material to or from an interface.

7. The method of claim 1, wherein injecting gas into a cure-in-place thermal interface material comprises injecting nitrogen into a cure-in-place thermal interface material having a thermal conductivity of at least about 2 Watts per meter Kelvin (W/mK).

8. The method of claim 1, wherein injecting gas into a cure-in-place thermal interface material comprises injecting gas into a thermoset two-part, silicone-based thermal gap filler.

9. The method of claim 1, wherein injecting gas into a cure-in-place thermal interface material comprises injecting gas into a two-part cure-in-place thermal interface material that includes a first part A and a second part B, and wherein:

the first part A includes silicone, aluminum oxide, and melamine;

the second part B includes silicone, aluminum oxide, and melamine; and one of the first part A or the second part B includes a catalyst for initiating the curing process.

10. The method of claim 9, wherein:
the first part A and the second part B are separately introduced into and mixed within a mixer before injecting the gas; and injecting the gas comprises injecting the gas into a mixture of the first part A and the second part B.

11. The method of claim 10, wherein the compressible foamed thermal interface material consists of the first part A, the second part B, and the injected gas that remains within the closed pores of the compressible foamed thermal interface, and/or wherein the compressible foamed thermal interface material is made without using foaming agent.

12. The method of claim 1, wherein injecting the gas comprises injecting the gas at least about 2000 revolutions per minute such that the gas is chopped and mixed into the cure-in-place thermal interface material.

13. The method of claim 1, wherein:
the compressible foamed thermal interface has a lower thermal conductivity than the cure-in-place thermal interface material due to entrapped gas within the closed pores of the compressible foamed thermal interface; and the compressible foamed thermal interface has a pore density within a range from about 20% to about 50%.

14. The method of claim 1,
wherein after exposing the cure-in-place thermal interface material to atmosphere after injecting the gas, the method further includes curing the foamed cure-in-place thermal interface material to thereby provide the compressible foamed thermal interface material.

15. The method claim 14, wherein exposing the cure-in-place thermal interface material to atmosphere comprises dispensing the cure-in-place thermal interface material onto a surface for use between battery walls of an electrical vehicle whereby the compressible foamed thermal interface is expandable and contractable during thermal cycling without having to physically move the compressible foamed thermal interface material to or from an interface between the compressible foamed thermal interface material and one or more of the battery walls.

16. The method of claim 14, wherein:
injecting gas into a cure-in-place thermal interface material comprises injecting gas into a cure-in-place thermal interface material having a thermal conductivity of at least about 2 Watts per meter Kelvin (W/mK); and the compressible foamed thermal interface material has a thermal conductivity of at least about 1.5 Watts per meter Kelvin (W/mK), which is lower than the thermal conductivity of the cure-in-place thermal interface material due to the injected gas that remains entrapped within the closed pores of the compressible foamed thermal interface.

17. The method of claim 14, wherein:
the cure-in-place thermal interface material includes a matrix and thermally-conductive filler within the matrix; and the compressible foamed thermal interface consists essentially of the matrix, the thermally-conductive filler within the matrix, and the injected gas that remains entrapped within the closed pores of the compressible foamed thermal interface.

18. The method of claim 1, wherein:
dispensing the cure-in-place thermal interface material onto a surface comprises dispensing the cure-in-place thermal interface material onto a surface of a board level shield, a housing, a heat source, and/or a heat dissipation/removal structure;

allowing the foamed cure-in-place thermal interface material to cure in place on the surface comprises curing the foamed cure-in-place thermal interface material on the surface of the board level shield, the housing, the heat source, and/or the heat dissipation/removal structure, thereby providing the compressible foamed thermal interface material on the surface of the board level shield, the housing, the heat source, and/or the heat dissipation/removal structure; and the method includes compressing the compressible foamed thermal interface material along an interface between the heat source and the board level shield, the housing, and/or the heat dissipation/removal structure, such that the compressible foamed thermal interface material establishes a thermally-conductive heat path having a thermal conductivity of at least about 1.5 Watts per meter Kelvin (W/mK) from the heat source through the compressible foamed thermal interface material to the board level shield, the housing, and/or the heat dissipation/removal structure, and the compressible foamed thermal interface material is expandable and contractable during thermal cycling without having to physically move the compressible foamed thermal interface material to or from the interface.

19. The method of claim 1, wherein:
the cure-in-place thermal interface material includes a matrix and thermally-conductive filler within the matrix; and the compressible foamed thermal interface consists essentially of the matrix, the thermally-conductive filler within the matrix, and the injected gas that remains entrapped within the closed pores of the compressible foamed thermal interface.

20. The method of claim 1, wherein:
injecting gas into a cure-in-place thermal interface material comprises injecting gas into a cure-in-place thermal interface material having a thermal conductivity of at least about 2 Watts per meter Kelvin (W/mK); and the compressible foamed thermal interface material has a thermal conductivity of at least about 1.5 Watts per meter Kelvin (W/mK) that is lower than the thermal conductivity of the cure-in-place thermal interface material due to the injected gas that remains entrapped within the closed pores of the compressible foamed thermal interface.

* * * * *